(12) United States Patent
Olsen

(10) Patent No.: US 10,658,906 B2
(45) Date of Patent: *May 19, 2020

(54) SERVO MOTOR SYSTEM AND METHOD

(71) Applicant: Milton D. Olsen, Manti, UT (US)

(72) Inventor: Milton D. Olsen, Manti, UT (US)

(73) Assignee: Milton D. Olsen, Manti, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/199,168

(22) Filed: Nov. 24, 2018

(65) Prior Publication Data

US 2019/0363614 A1     Nov. 28, 2019

Related U.S. Application Data

(63) Continuation-in-part of application No. 15/844,870, filed on Dec. 18, 2017, now Pat. No. 10,161,764, which is a continuation-in-part of application No. 15/143,508, filed on Apr. 30, 2016, now Pat. No. 9,874,460.

(51) Int. Cl.
| | |
|---|---|
| *G01B 7/14* | (2006.01) |
| *G01D 5/14* | (2006.01) |
| *G01D 5/20* | (2006.01) |
| *H02K 11/215* | (2016.01) |
| *H02P 6/185* | (2016.01) |
| *H02P 6/17* | (2016.01) |

(52) U.S. Cl.
CPC .............. *H02K 11/215* (2016.01); *H02P 6/17* (2016.02); *H02P 6/185* (2013.01)

(58) Field of Classification Search
CPC .......... G01D 5/20; G01D 5/142; G01D 5/145; G01D 5/2006; G01P 3/44; G01P 3/487; G01P 13/04; G01P 13/045; E05F 15/40; E05F 15/603; E05F 15/632; E05F 15/643
See application file for complete search history.

(56) References Cited

U.S. PATENT DOCUMENTS

| | | | | |
|---|---|---|---|---|
| 5,367,257 A | * | 11/1994 | Garshelis | G01P 3/44 324/165 |
| 6,624,603 B2 | * | 9/2003 | Preymann | G01D 5/2457 318/280 |
| 10,161,764 B2 | * | 12/2018 | Olsen | G01P 3/487 |
| 2011/0018528 A1 | * | 1/2011 | Semineth | G01D 5/2451 324/207.25 |
| 2016/0041008 A1 | * | 2/2016 | Wang | G01D 5/16 324/207.21 |

* cited by examiner

*Primary Examiner* — Minh N Tang
(74) *Attorney, Agent, or Firm* — Malone IP Law; Steven J. Malone

(57) ABSTRACT

A servo motor system and method has been developed to provide speed, orientation, location, and/or direction detection using a single inductive sensor. Direction, orientation, speed, and/or location detection are detected using a single channel inductive sensor in a servo motor control system. Mechanical control systems using servo motors are easily upgraded with added safety, precision control, and automation using the inductive sensor system described herein.

20 Claims, 18 Drawing Sheets

SERVO MOTOR SYSTEM AND METHOD

RELATED APPLICATIONS

This application is a continuation-in-part of allowed U.S. patent application Ser. No. 15/844,870 filed on Dec. 18, 2017, now U.S. Pat. No. 10,161,764 which is a continuation-in-part of granted U.S. patent application Ser. No. 15/143,508, now U.S. Pat. No. 9,874,460 filed on Apr. 30, 2016 which are hereby incorporated by reference.

BACKGROUND

Summary

A servo motor system includes one or more magnets fixed to a moving component of the servo motor system, each of the one or more magnets having a north pole and a south pole aligned to alternately induce a magnetic field into a face of an inductive sensor; a processor and memory non-transitively programmed to: determine an ON time of the inductive sensor as a result of moving the north pole and the south pole of each of the one or more magnets past the inductive sensor in an unknown direction; determine the unknown direction to be a known first direction or a known second direction when the ON time is equal to a predetermined threshold associated with the first known direction or a predetermined threshold associated with the second known direction; and one or more servo motors that receive control signals as a result of the moving of the north poles and the south poles of each of the one or more magnets past the inductive sensor, wherein the one or more servo motors cause motion of a mechanical system. The mechanical system may be a robotic arm, an assembly line, or an electro-mechanical machine. The unknown direction may be a rotational direction or a linear direction of movement. The inductive sensor, in combination with a processor or controller, may additionally detect speed, orientation, and/or position of a rotating or linearly moving component. The inductive sensor may be a Hall Effect sensor. The inductive sensor may be mounted to a servo motor or to a servo motor cover. The face of the inductive sensor may be positioned perpendicular to a north-south direction of each of the one or more magnets. The face of the Hall Effect sensor may be positioned between 1 and 0.010 of an inch from a surface of the one or more magnets. The servo motor speed of rotation may be between 1 and 20,000 rotations per minute. The one or more magnets may be attached to a rotational drive system. The servo motor system may additionally comprise one or more cable drive systems. The inductive sensor may provide direction, position, and/or location of at least one cable of the cable drive systems. The inductive sensor may provide signals that improve safety and control of the mechanical system. Positional safety threshold parameters related to direction of rotation, position, and/or orientation may used to achieve improved safety and control of the mechanical system. A load weight or torque of a mechanical system may be determined using signals from the inductive sensor and motor current. The load weight may be a weight exerted on the one or more cable drive systems. The mechanical system may comprise two or more cable drive systems. The mechanical device may be a manufacturing tool. The mechanical system may be controlled in part by feedback produced by the inductive sensor.

Apparatus and methods in accordance with the invention have been developed to provide direction detection of a moving object or moving component using a single inductive sensor. Direction detection, speed detection, and location detection may each be provided by the same inductive sensor and used as feedback in a motion control system. Control systems of tractors, draglines, power shovels, and cranes may be easily upgraded with added safety, precision control, and automation using an inductive sensor system as disclosed herein. The features and advantages of the invention will become more fully apparent from the following description and appended claims.

A tractor device with one or more magnets fixed to a moving component of the tractor device, each of the one or more magnets having a north pole and a south pole aligned to alternately induce a magnetic field into a face of an inductive sensor. A processor and memory non-transitively programmed to determine an ON time of the inductive sensor as a result of moving the north pole and the south pole of each of the one or more magnets past the inductive sensor in an unknown direction, determine the unknown direction to be a known first direction or a known second direction when the ON time is equal to a predetermined threshold associated with the first known direction or a predetermined threshold associated with the second known direction. One or more motors receive control signals as a result of the moving of the north poles and the south poles of each of the one or more magnets past the inductive sensor. The tractor device may be a dragline, power shovel, or a crane. The unknown direction may be a rotational direction. The unknown direction may be a linear direction. The inductive sensor may be used for additional detection of speed and position. The inductive sensor may be a hall effect sensor. The inductive sensor may be mounted within a rotating cover. The face of the inductive sensor may be positioned perpendicular to a north-south direction of each of the one or more magnets. The face of the hall effect sensor may be positioned between 1 and 0.010 of an inch from a surface of the one or more magnets. A speed of the rotation direction may be between 1 and 20,000 rotations per minute. The one or more magnets may be attached to a rotational drive system of the tractor device. The tractor device may additionally comprise one or more cable drive systems. The inductive sensor may provide direction, position, and location of at least one cable of the cable drive systems. The inductive sensor may provide signals that improve safety and control of the tractor. Positional safety threshold parameters related to direction of rotation may be used to achieve improved safety and control. A load weight may be determined using signals from the inductive sensor and motor current. The load weight may be a weight exerted on the one or more cable drive systems. The tractor device may comprise two or more cable drive systems. The tractor device maybe a mining tractor. The mining tractor may be controlled, in part, by feedback produced by the inductive sensor.

A system and method is provided for detection of a direction of movement of a component using a single inductive sensor. The component may be a rotational component such as a motor, shaft, gear, or the like. An ON and/or OFF time of the inductive sensor is measured as north and south poles of one or more magnets are moved past a face of the inductive sensor. A directional correlation is established which allows for determination of an unknown direction of movement.

Consistent with the foregoing, a system and method for providing direction detection of a moving object or moving component is disclosed. Such a system includes a rotational component with one or more magnets fixed thereto, a power source for powering the inductive sensor, and a processor configured to determine an ON time and OFF time of the inductive sensor as the moving component rotates the north and south poles of each of the one or more magnets past a face of the inductive sensor. A corresponding method is also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, may be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings.

Figure 1:
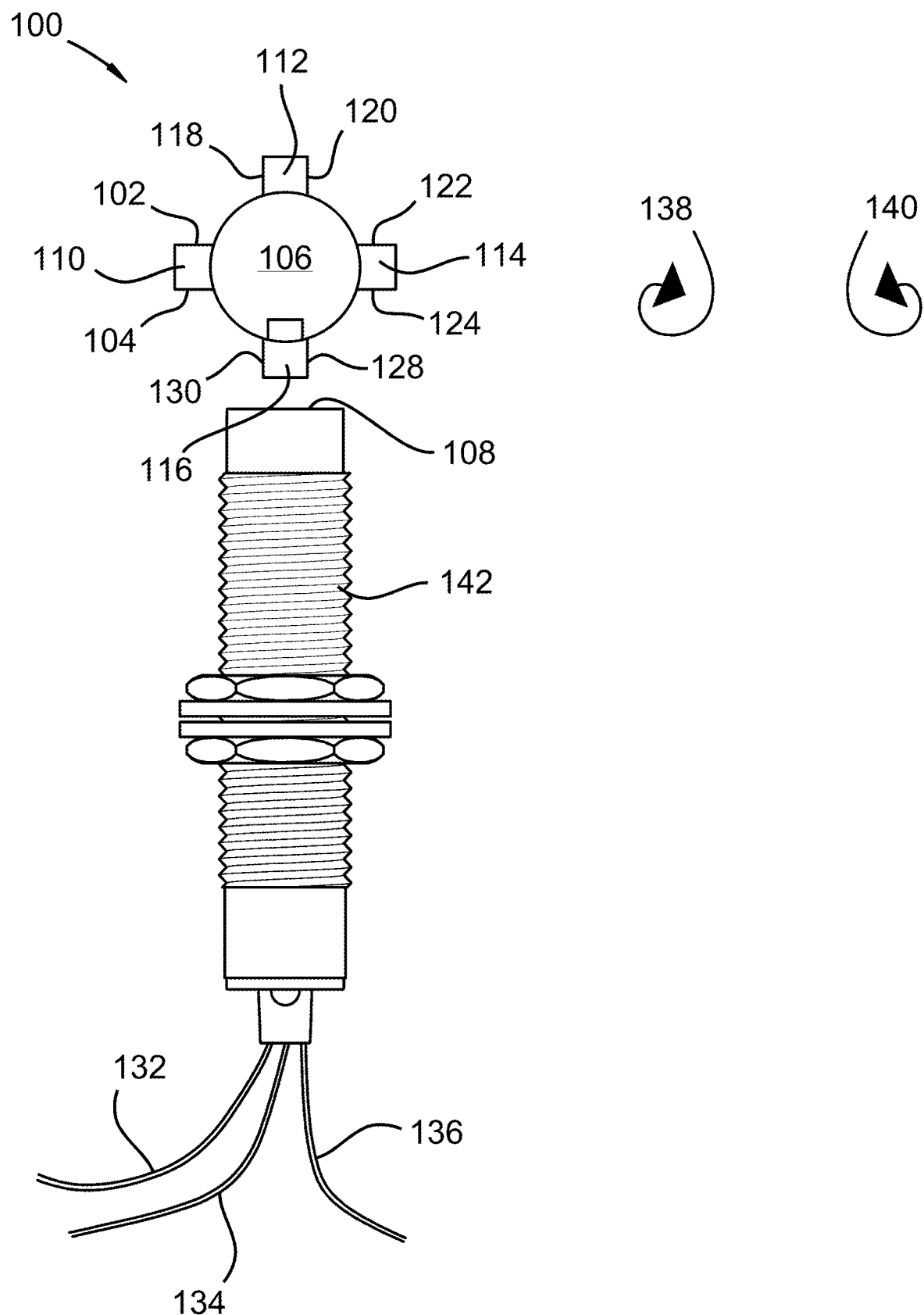
FIG. 1 is a top view showing an embodiment of a moving component with more than one magnet and an inductive sensor in accordance the invention.

Referring to FIG. 1, a view of a rotational moving component 106 is shown with magnets 110, 112, 114, and 116 attached thereto. Each of the north poles 104, 118, 122, and 128 are alternately arranged with the south poles 102, 120, 124, and 130 around moving component 106. An inductive sensor face 108 is positioned in a fixed position in a close proximity to magnets 110, 112, 114, and 116 such that when moving component 106 rotates each north pole and each south pole of each magnet 110, 112, 114 and 116 pass in front of inductive sensor face 108 causing a magnetic field to penetrate into the sensor face 108. The inductive sensor 142 may have three or more wires for powering the inductive sensor and providing an output of an ON state or OFF state of the sensor 142. Moving component 106 may rotate in a clockwise direction 138 or a counter clockwise direction 140.

The inductive sensor face 108 may be positioned perpendicular to a north-south direction of each of the one or more magnets 110, 112, 114, and 116.

Figure 2A:
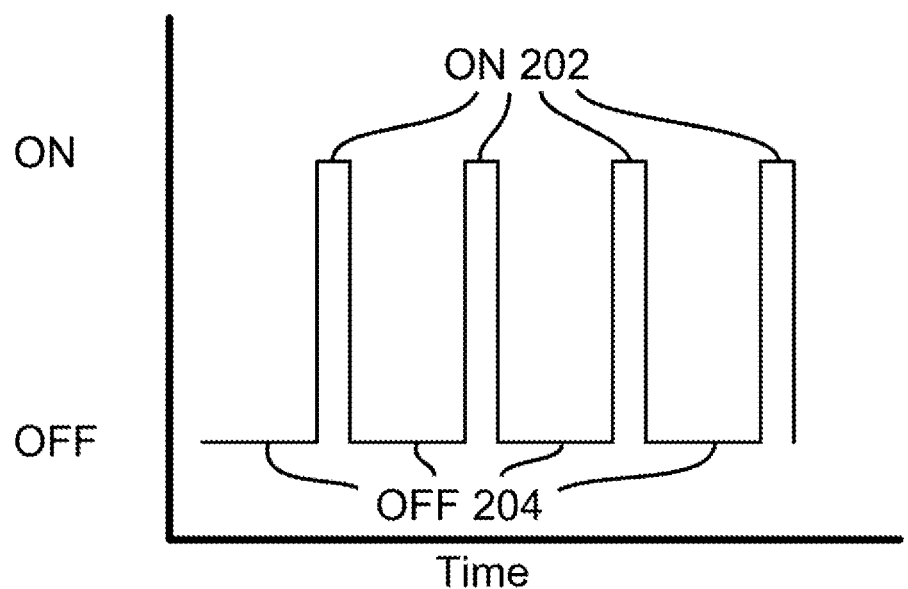
FIGS. 2a and 2b are timing diagrams of directional ON and OFF outputs of an inductive sensor in accordance with an embodiment of the present invention.
Figure 2B:
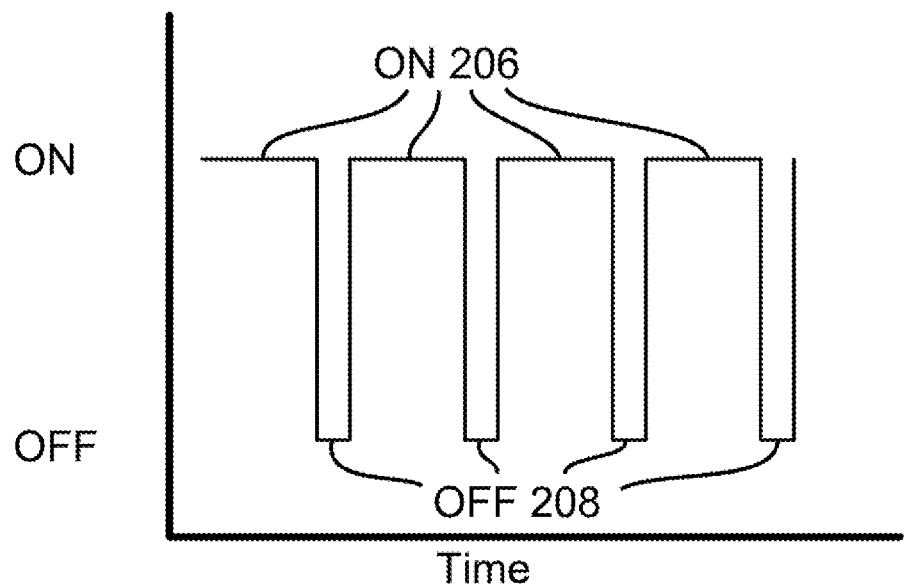
Figure 10:
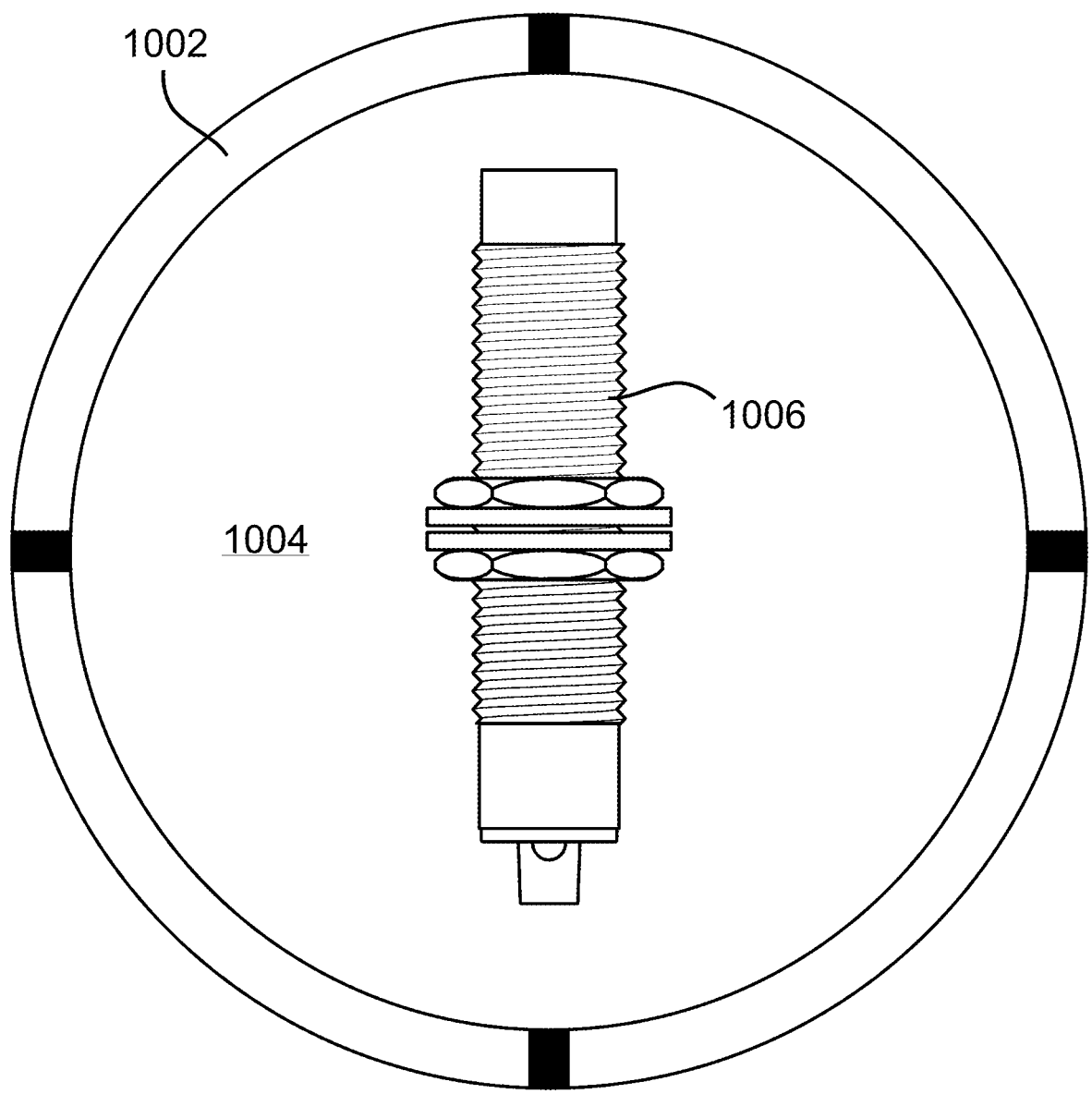
FIG. 10 is a top view of an extruded rotational cylinder with an inductive sensor and magnets in an inner area of the cylinder.

In FIGS. 2a and 2b, timing output diagrams of a sensor system as shown in FIG. 10 is presented for two directions of movement of a moving component such as is shown in FIG. 1. FIG. 2a shows one direction of movement with an ON time of an inductive sensor as a function of north and south poles of magnets passing a face of the inductive sensor. FIG. 2b is on the same time scale and uses the same rotational speed as is shown in relation to FIG. 2a. The ON time 202 shown in FIG. 2a represents a first direction of motion and the ON time of FIG. 2b represents a second direction of motion of a system of the present invention. It is clearly evident that the ON time 202 of FIG. 2a is less than the ON time 206 of FIG. 2b. Each cycle shown is a result of a north and south pole of a magnet being rotated past the face of an inductive sensor. When the rotation direction is reversed, the ON timing and OFF timing also change. When the inductive sensor senses the changing magnetic poles a delay in switching of the output of the inductive sensor takes place. This difference can be utilized to determine a direction of rotation in accordance with the invention herein disclosed.

Figure 3:
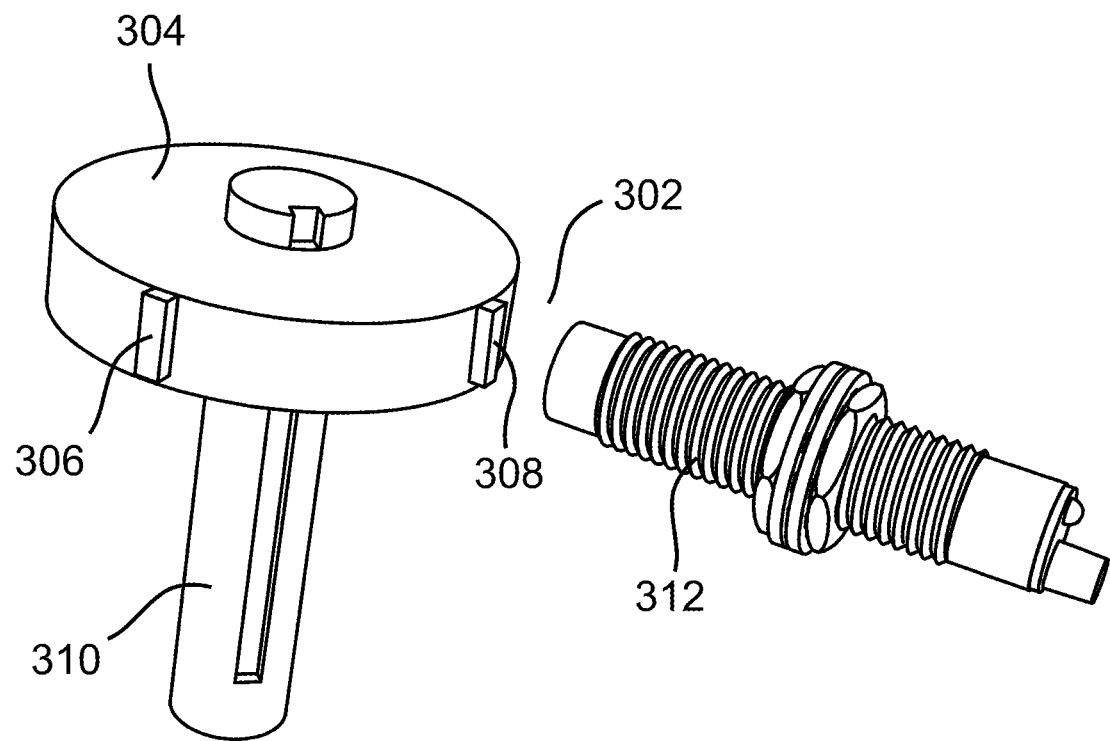
FIG. 3 is a perspective view of a moving component with more than one magnet and an inductive sensor in accordance with an embodiment of the invention.

In FIG. 3, a disk 304 is attached to a rotational shaft 310 with magnets 306 and 308 on an outer surface of disk 304. Here disk 304 only uses two magnets 306 and 308. These magnets need not be at 180 degrees separated from each other. Inductive sensor 312 is located at a distance 302 from magnet 308. Distance 302 is optimally from 0.010 to 1 inch. Inductive sensor 312 may be a Hall effect sensor or other inductive sensor which is capable of sensing a changing magnetic field.

Figure 4:
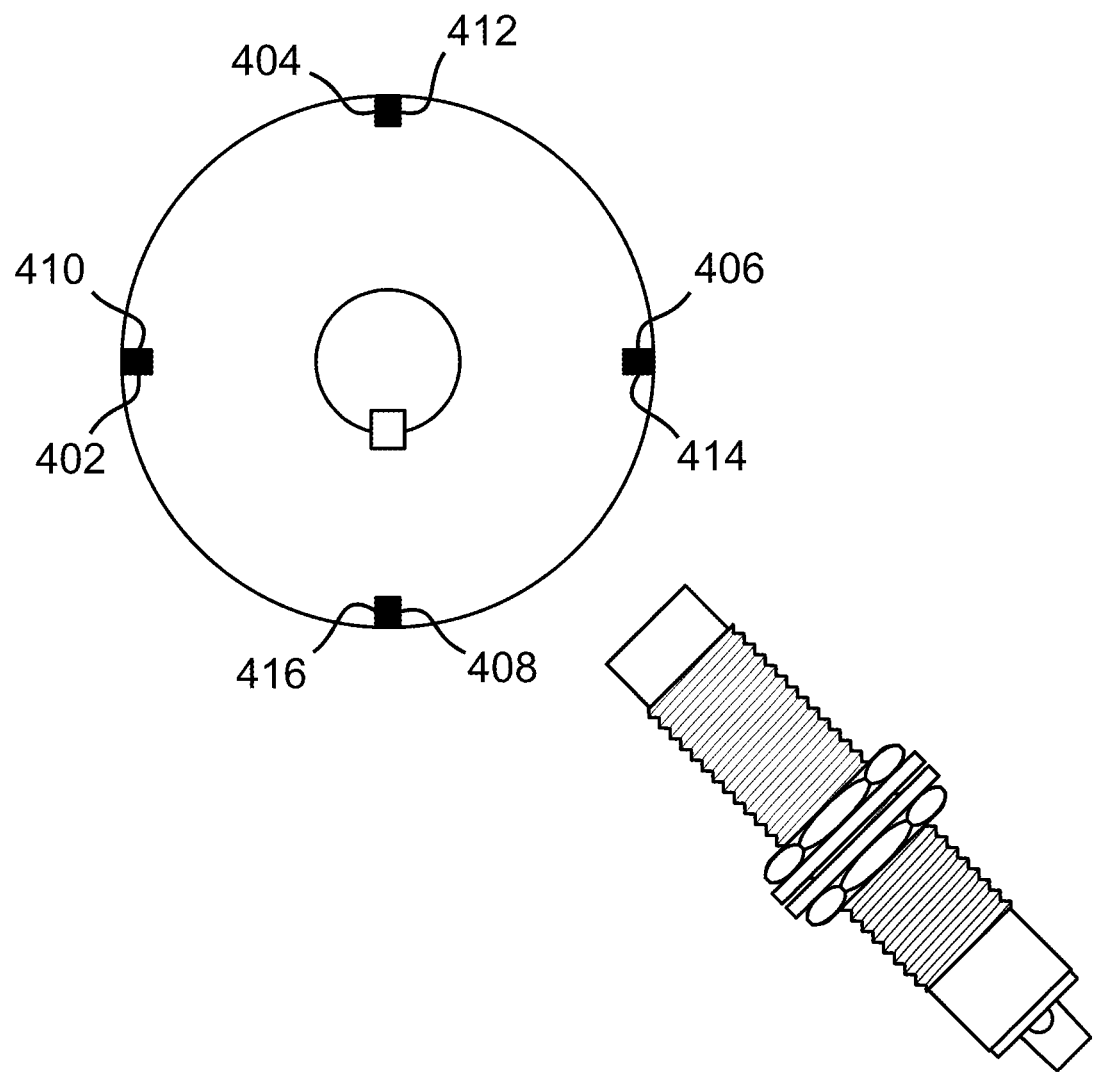
FIG. 4 is a top view of a moving component with more than one magnet and an inductive sensor in accordance with an embodiment of the invention.

FIG. 4 shows a top view with magnets inset in a cylinder or disk. The magnets are arranged with north poles 402, 404, 406 and 408 in a similar side of each magnet and south poles 410, 412, 414, and 416 on similar opposite sides of the magnets. The north and south poles need to be consistently placed in reference to a similar side of the magnet. Accordingly, poles 402, 404, 406, and 408 can all either be "North" poles or "South" poles. The same is true with poles 410, 412, 414, and 416.

Figure 5:
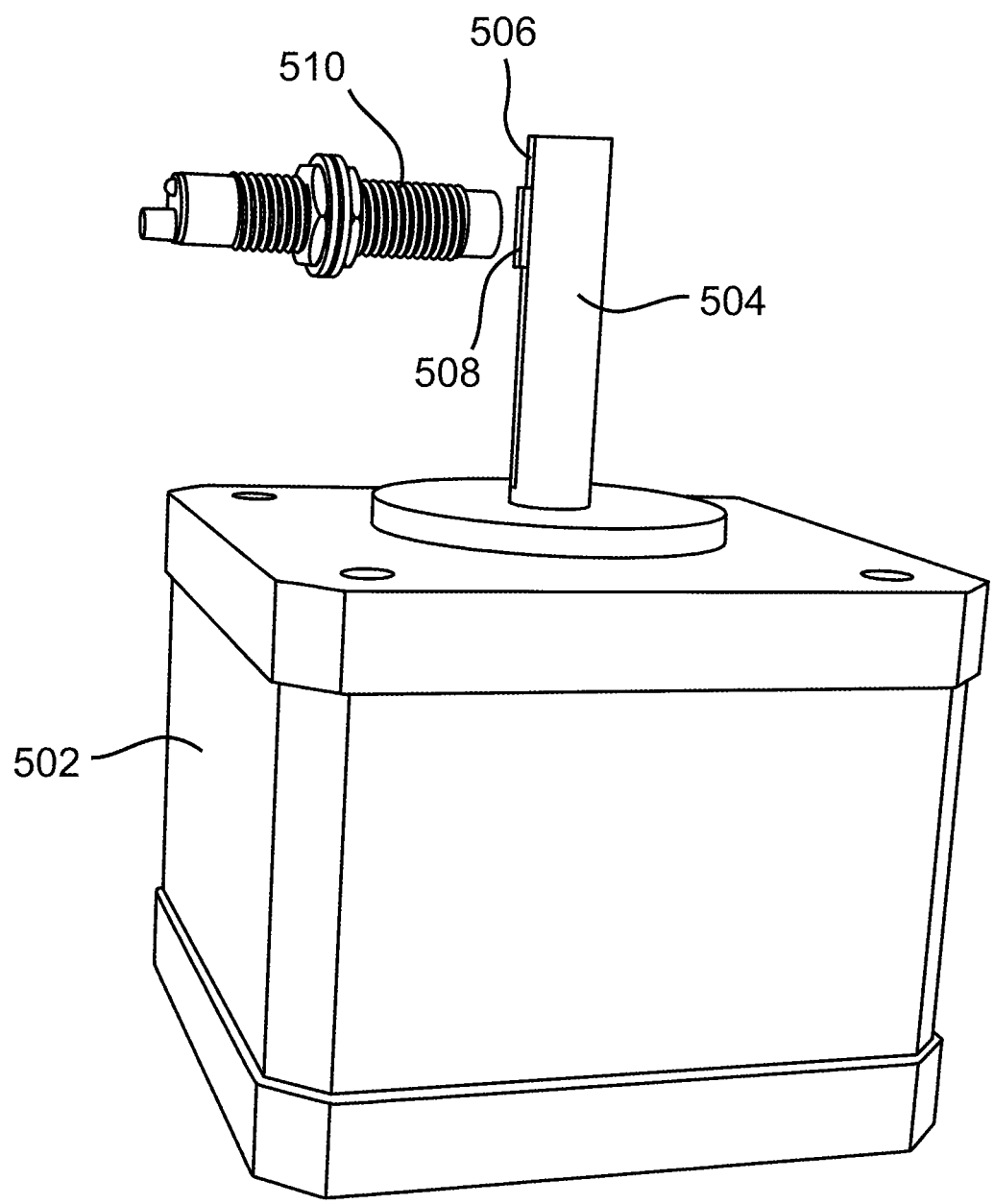
FIG. 5 is a perspective view of a moving component with more than one magnet and an inductive sensor in accordance with an embodiment of the invention.

FIG. 5 shows a motor 502 with a magnet 508 in a keyway 506 of the motor shaft 504. Here only one magnet 508 is used to determine a direction of rotation of the motor shaft. The north and south poles of the magnet are rotated past sensor 510 in order to determine a direction of rotation of the motor shaft.

Figure 6:
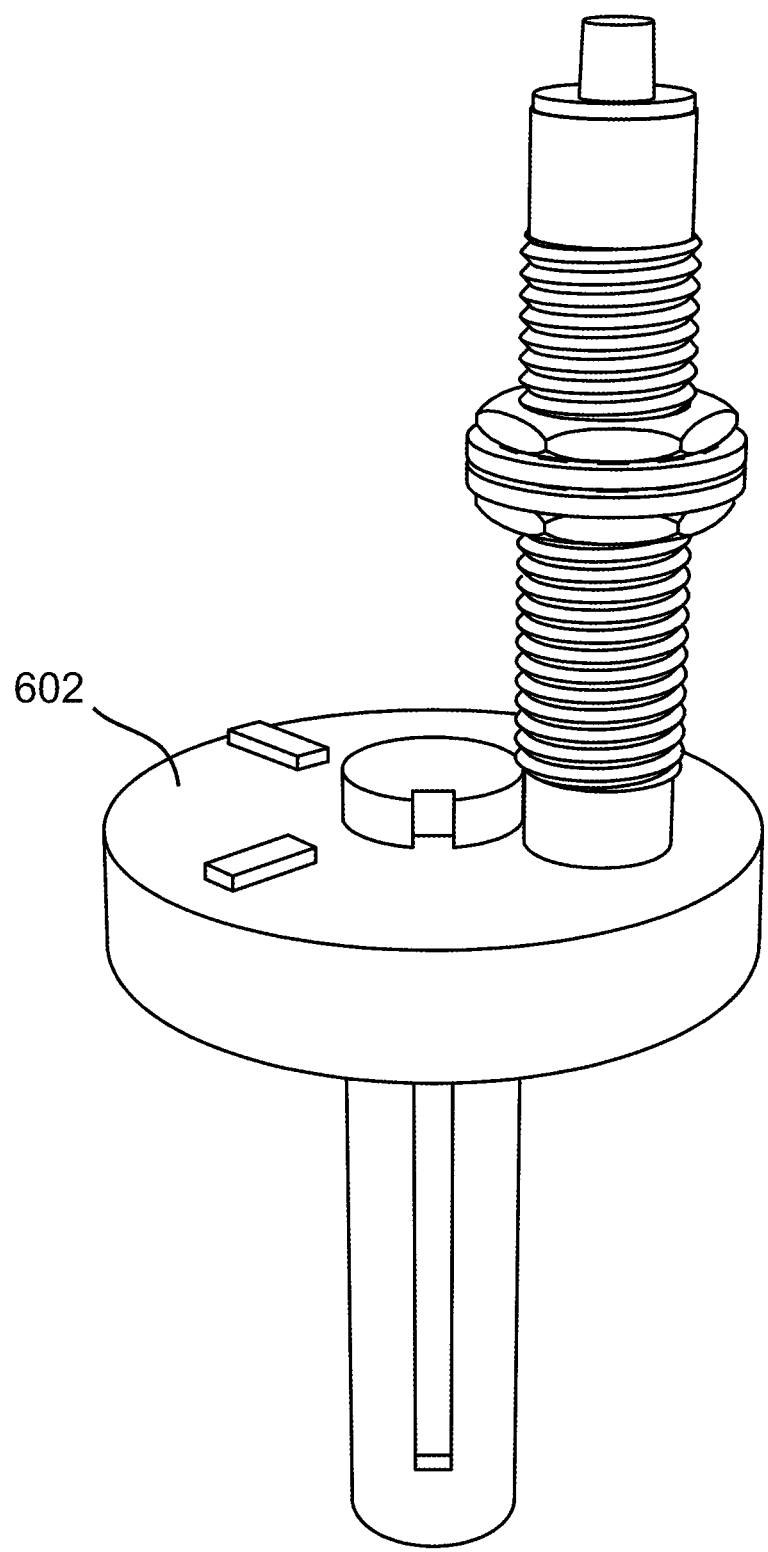
FIG. 6 is a perspective view of a moving component with more than one magnet and an inductive sensor in accordance with an embodiment of the invention.

In FIG. 6, we have a disk with magnets partially embedded in a face 602 of a moving component.

Figure 7:
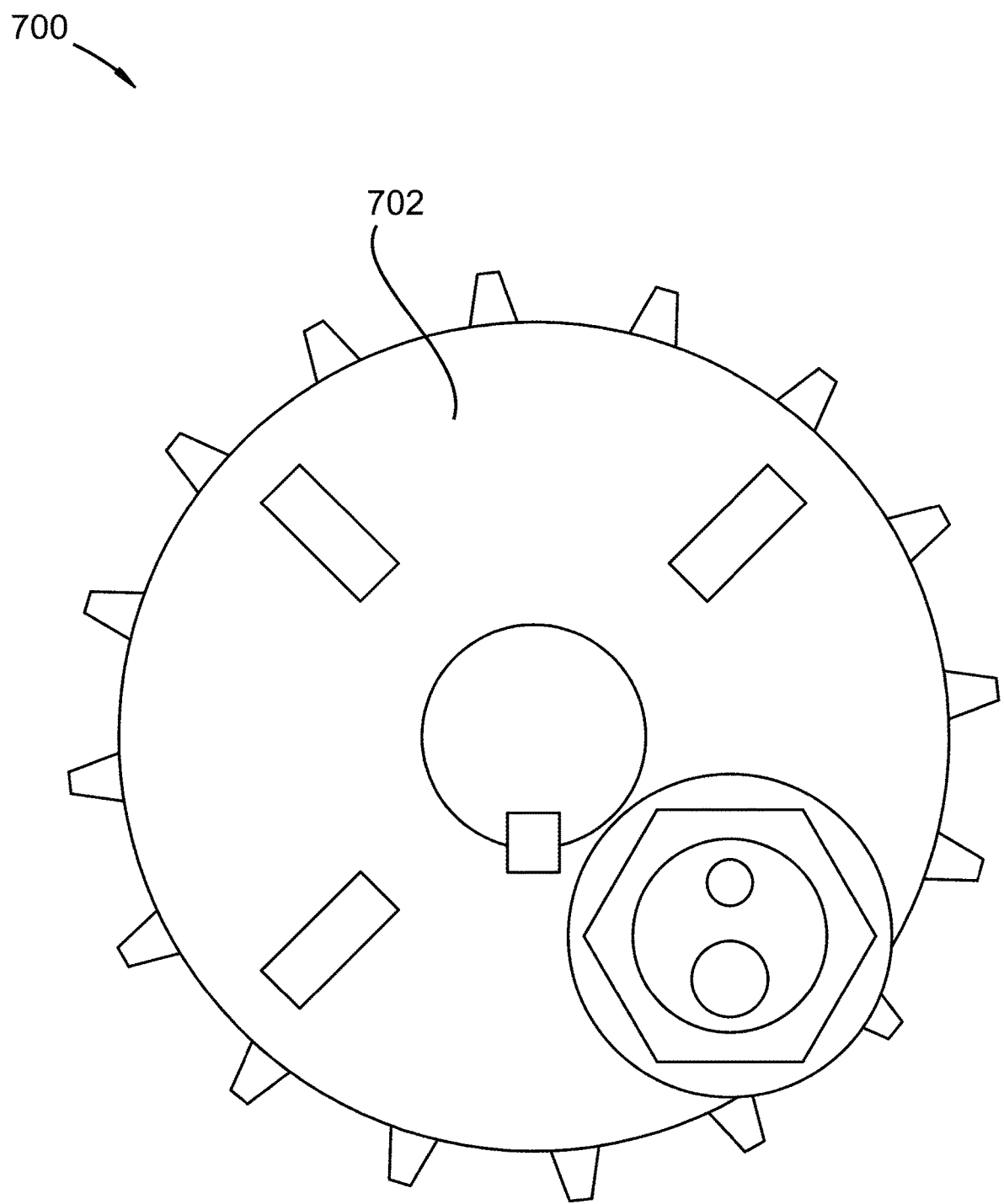
FIG. 7 is a top view of a moving component with more than one magnet and an inductive sensor in accordance with an embodiment of the invention.

In FIG. 7, a gear system 700 is shown with magnets embedded in gear face 702. The gear may be made out of metal, plastic, wood, polymer, carbon fiber, non-ferrous metals, ceramic, rubber, elastomeric compounds, glass, or petroleum.

Figure 8:
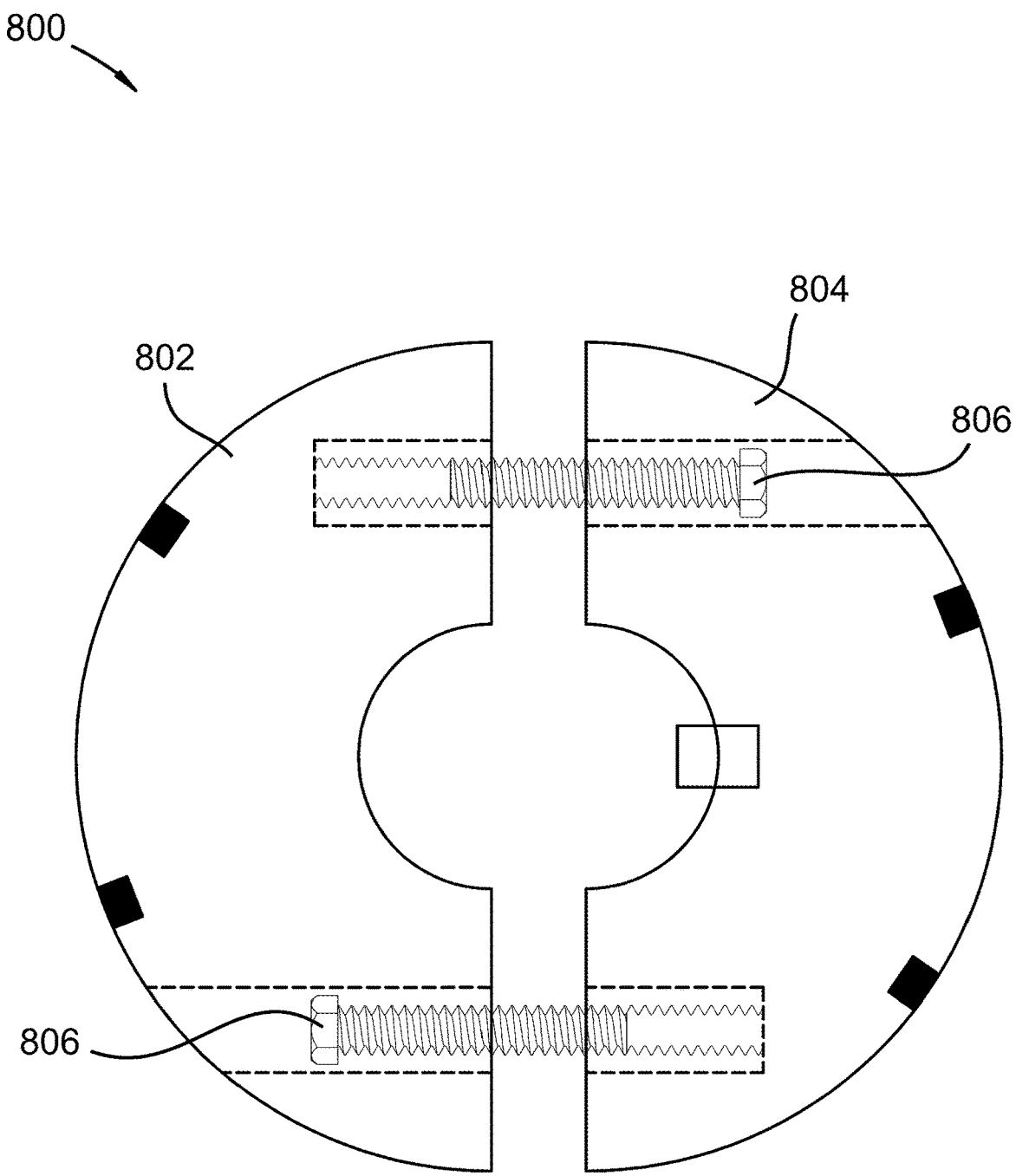
FIG. 8 is a top view of a split rotational moving component with more than one magnet in accordance with an embodiment of the invention.

In FIG. 8, a split rotational component or clamping cylinder 800 containing magnets in an outer surface is shown. The magnets may be place on any surface of the split rotational component which allows the north and south poles of each magnet to be rotated past a face of an inductive sensor. The magnets may be embedded, partially embedded or on a surface of a rotational component of the invention. Rotational component 800 may be split into two sections 802 and 804 by removal of fasteners 806. A split rotational component 800 may be fastened on to a rotational shaft without removing existing components on a rotational shaft.

Figure 9:
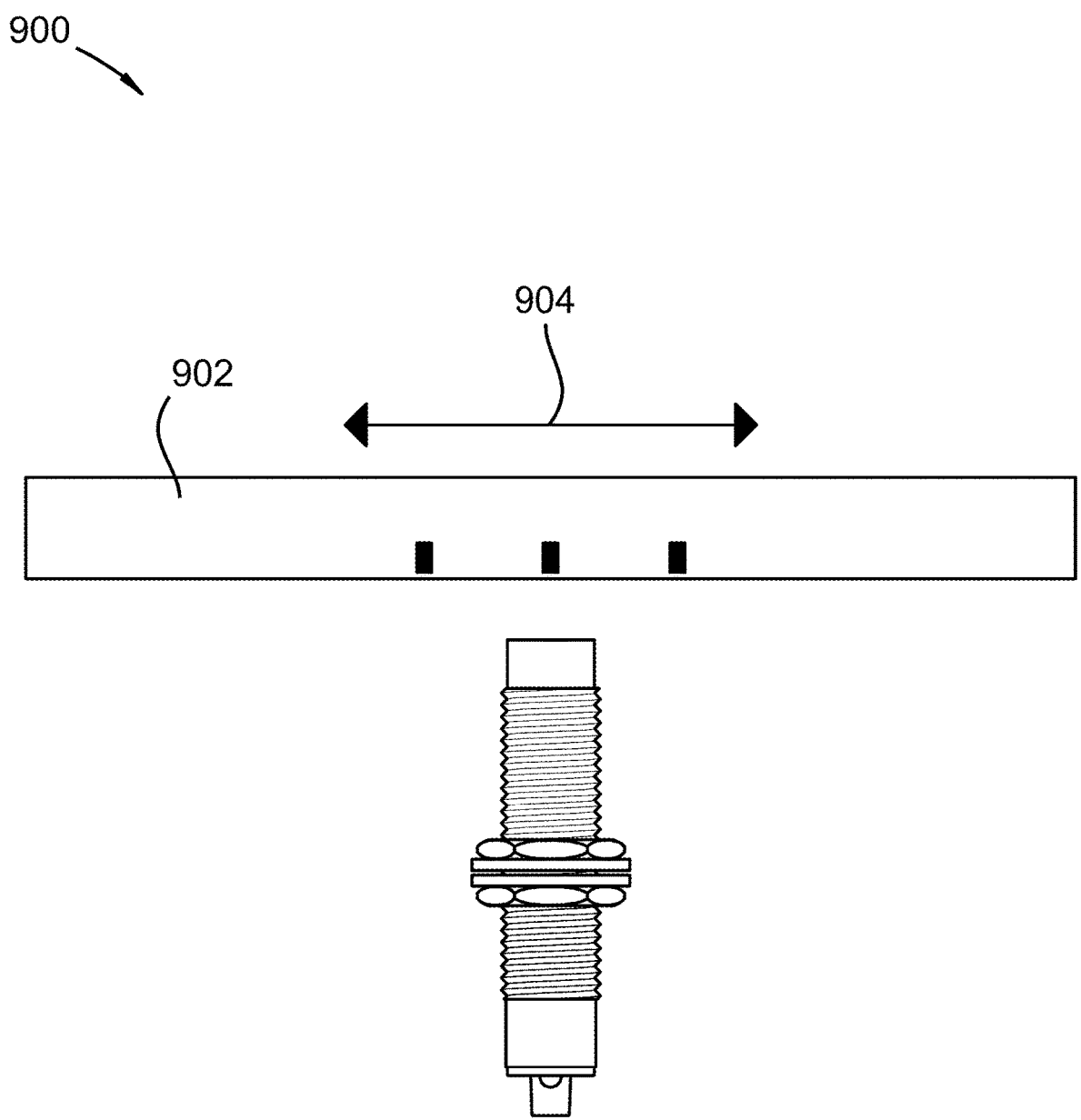
FIG. 9 is a top view of a moving component with more than one magnet and an inductive sensor in accordance with an embodiment of the invention.

FIG. 9, shows a linear moving component 902 for moving in a liner fashion as indicated at 904.

FIG. 10 is a top view of an extruded rotational cylinder 1002 with an inductive sensor 1006 and magnets in an inner area of the cylinder. The inductive sensor 1006 is fixed within the extruded cylinder area 1004. This configuration may provide increase protection to the magnets and inductive sensor and may be useful in harsh environments such as mines and other indoor and outdoor hazard areas. The rotational cylinder 1002 may be connected to a rotating shaft or driven by a chain or other drive mechanism (not shown).

Figure 11:
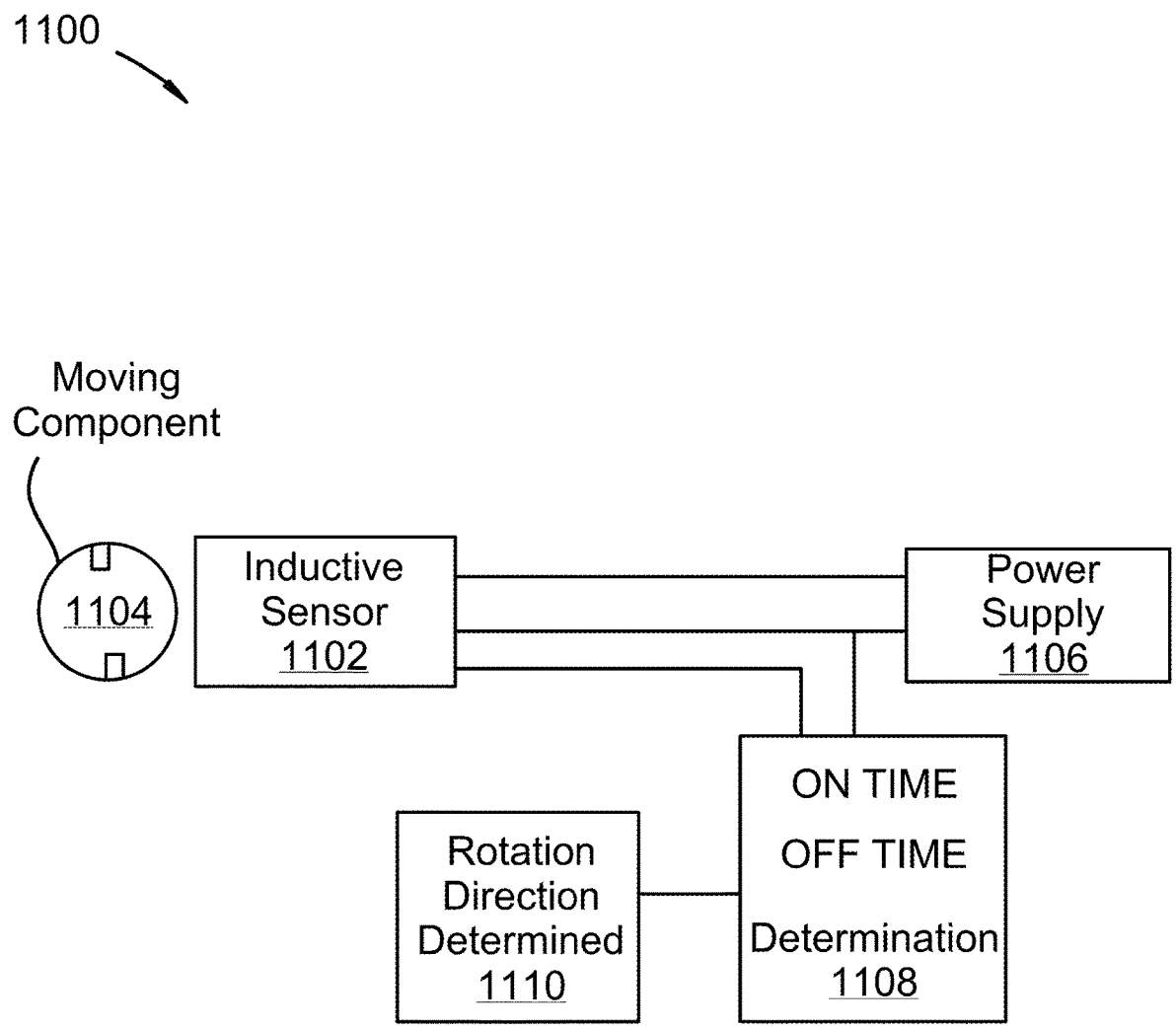
FIG. 11 is a schematic flow diagram of a system for determining direction in accordance with an embodiment of the invention.

FIG. 11, shows a schematic block diagram of a system of the present invention. A method of determining a direction of movement will be described in relation to this Figure.

Sensor system 1100 is shown with magnets attached to moving component 1104, inductive sensor 1102, power supply 1106, ON/OFF time determination unit 1108, and rotation direction determination unit 1110. ON/OFF time determination unit 1108 and Rotation direction determination unit 1110 may be one or more computers or one or more application specific integrated circuit devices. Computer device 1108 may count magnetic pulses from inductive sensor 1102 in order to additionally determine speed and position in addition to direction of movement. Sensor system 1100 may serve as a positional encoder, speed encoder, and/or a directional encoder. Moving component 1104 rotates in a first known (clockwise direction) and inductive sensor switches from an ON state to an OFF state as moving component 1104 rotates. An ON time is determined as a function of rotation speed and the ON time is recorded in a memory of determination system 1108. The ON time may be determined by many different ways which are well known in the art of signal processing. Such ways may include positive to negative signal transitions, sampling within an ON time with a known frequency, etc. After the ON time is determined for the first known direction it is stored in a memory location of determination system 1108. Determination system 1108 may include process and memory, a micro-controller, a data acquisition device, a computer and program instruction for carrying out functions related to ON time detection of a sensor, storage of sensor value and comparing of sensor values. Determination system 1108 may also be configured to output a determination of a direction of rotation of moving component 1104. Next, moving component 1104 is rotated in a second known, opposite direction (counter clockwise), and the ON time is determined and stored in a similar way as that of the first direction. Predetermined bounds or thresholds of the ON times for the first and second directions may be set according to statistical curves allowing for a margin on each side of a fixed value. Next, moving component 1104 is rotated in an unknown direction (either clockwise or counter clockwise) and an ON time is determined and compared to the stored ON time values for known clockwise and counter clockwise rotations. The direction is then determined by choosing an ON time value which is closer to an ON time of a known direction. For example, if the known clockwise ON time was 6 milliseconds and the known counter clockwise ON time was 3 milliseconds and the unknown direction ON time was between a threshold of 2-4 milliseconds the determined direction would be counter clockwise. An ON time and/or OFF time and/or ratio of the ON time to the OFF time may be used to determine a direction of movement of a component.

Table 1 below shows results of rotation of a moving component 1104 and sampling data points at a fixed rate for ON times (high data points) and OFF time (low data points) for various sensor distances between the inductive sensor and the rotating magnets. Rotational speeds are also listed. It should be noted that inductive sensors may be setup in an active ON or active OFF configuration and the data points may swap positions depending on the hardware setup of the sensor and type of inductive sensor used. The inductive sensor used in the table below is a normally open type Hall effect proximity sensor. When rotating north and south poles of four magnets past a Hall effect sensor in a clockwise direction at 470 rotations per minute, 16847 samples at 25 kHz were obtained for an ON state time and when rotated in a counter clockwise direction about half of the data samples were obtained for an ON state. This shows a significant switching delay between rotation directions and an ON state of the inductive sensor used. The data is consistent even when the speed of rotation is changed.

TABLE 1

| direction | Hi data pts | Low Data pts | ratio | rpm | distance |
| --- | --- | --- | --- | --- | --- |
| CW | 16847 | 8753 | 1.889 | 470 | 0.2 |
| CCW | 8876 | 16724 | 0.5296 | 490 | 0.2 |
| CW | 16952 | 8648 | 1.9838 | 1018 | 0.2 |
| CCW | 8574 | 17026 | 0.5087 | 1058 | 0.2 |
| CW | 17415 | 8185 | 2.1287 | 1600 | 0.2 |
| CCW | 8293 | 17307 | 0.4608 | 1788 | 0.2 |
| CW | 13796 | 11804 | 1.172 | 529 | 0.3 |
| CCW | 11311 | 14289 | 0.8027 | 560 | 0.3 |
| CW | 13791 | 11809 | 1.1765 | 1092 | 0.3 |
| CCW | 11369 | 14231 | 0.8006 | 1118 | 0.3 |
| CW | 13692 | 11908 | 1.1534 | 1954 | 0.3 |
| CCW | 11288 | 14312 | 0.7845 | 1770 | 0.3 |
| CW | 13582 | 12018 | 1.134 | 3239 | 0.3 |
| CCW | 11273 | 14327 | 0.759 | 3322 | 0.3 |

Figure 12:
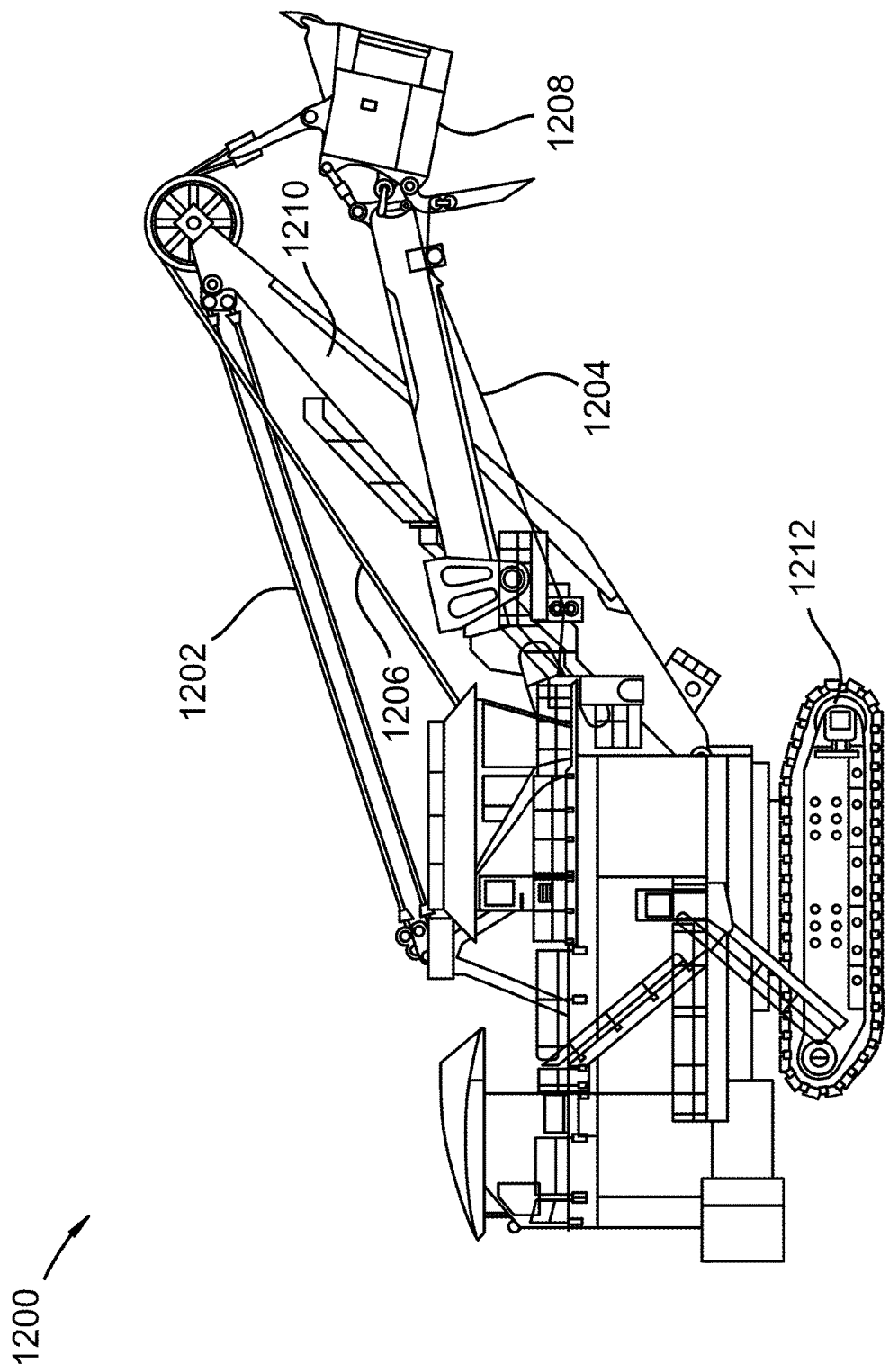
FIG. 12 is a side view of a power shovel in accordance with an embodiment of the invention.

FIG. 12 is a side view of a power shovel 1200 utilizing sensor system 1100, shown in FIG. 11, for motion control feedback of one or more moving systems of power shovel

1200. Cables 1202, 1204, and/or 1206 may be connected to a drive system utilizing sensor system 1100 for feedback control. An inductive sensor and/or one or more magnets of the sensor system may be attached to or placed in near proximity to rotational pulleys, drives, drums, motors, shafts, gears, wheels, rollers, pivots, and/or to linear moving tractor parts such as arms, tracks, shovels, and/or levers. Shovel 1208 may be controlled by one or more motors to perform an automated, repetitive movement to move large amounts of earth. Position, speed, and direction information may be used to provide software safety limits and automated stopping points for movements of power shovel 1200. Backwards slippage, over rotation, unexpected movement, unexpected positional data, and/or speed deviations may be detected using sensor system 1100. If brakes are worn, motors fail, or other equipment wear or equipment malfunctions, software safety parameters may trigger equipment shutdown or automated maintenance actions.

Figure 13:
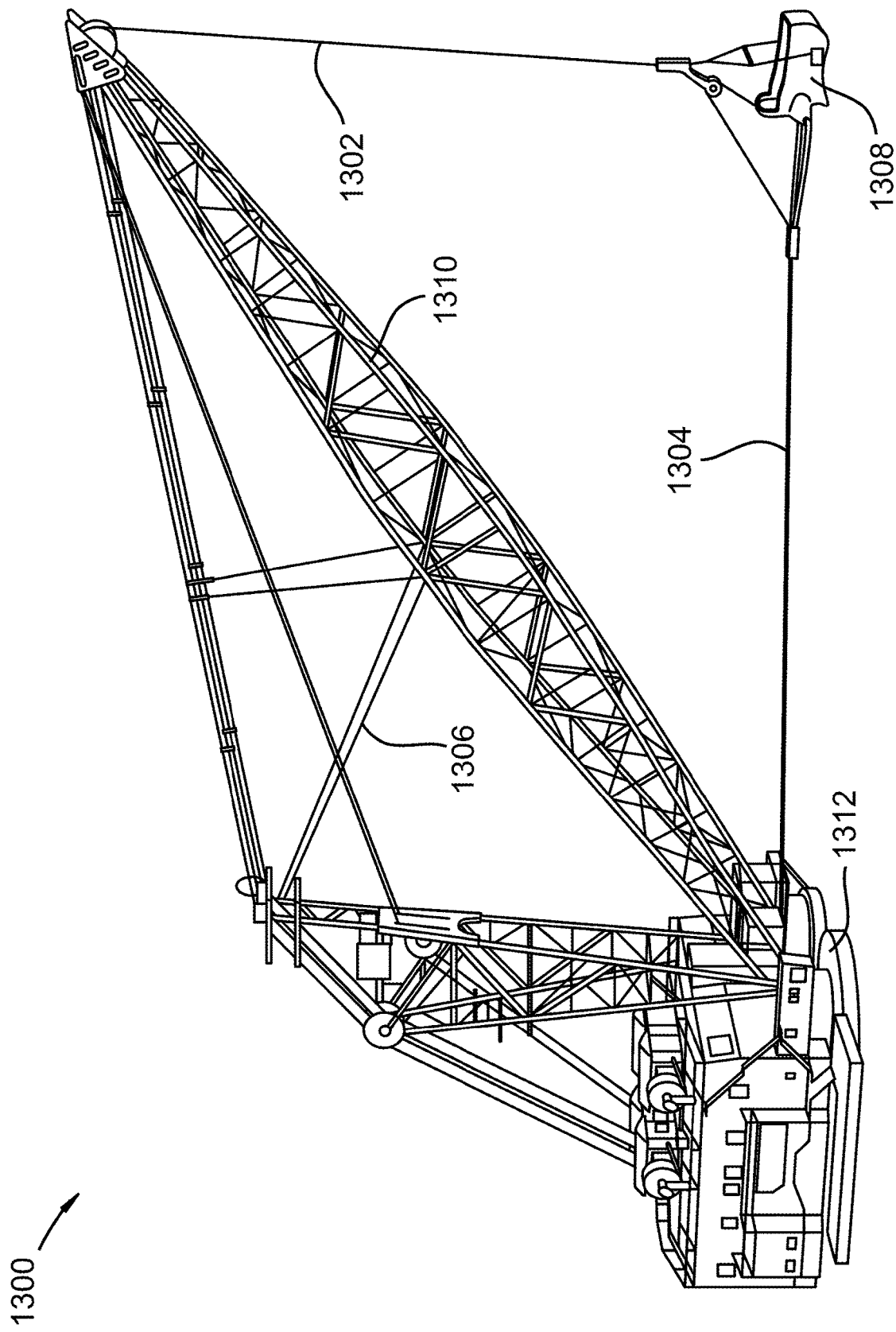
FIG. 13 is a side view of a dragline in accordance with an embodiment of the invention.

FIG. 13 is a side view of a dragline 1300 utilizing sensor system 1100, shown in FIG. 11, for motion control feedback of one or more moving systems of dragline 1300. Cables 1302, 1304, and/or 1306 may be connected to a drive system utilizing sensor system 1100 for feedback control. An inductive sensor and/or one or more magnets of the sensor system may be attached to or placed in near proximity to rotational pulleys, drives, drums, motors, shafts, gears, wheels, rollers, pivots 1312, and/or to linear moving tractor parts such as arms 1310, tracks, shovels, and/or levers. Shovel 1308 may be controlled by one or more motors to perform an automated, repetitive movement to move large amounts of earth. Position, speed, and direction information may be used to provide software safety limits and automated stopping points for movements of dragline 1300. Backwards slippage, over rotation, unexpected movement, unexpected positional data, and/or speed deviations may be detected using sensor system 1100. If brakes are worn, motors fail, or other equipment wear or equipment malfunctions, software safety parameters may trigger equipment shutdown or automated maintenance actions.

Figure 14:
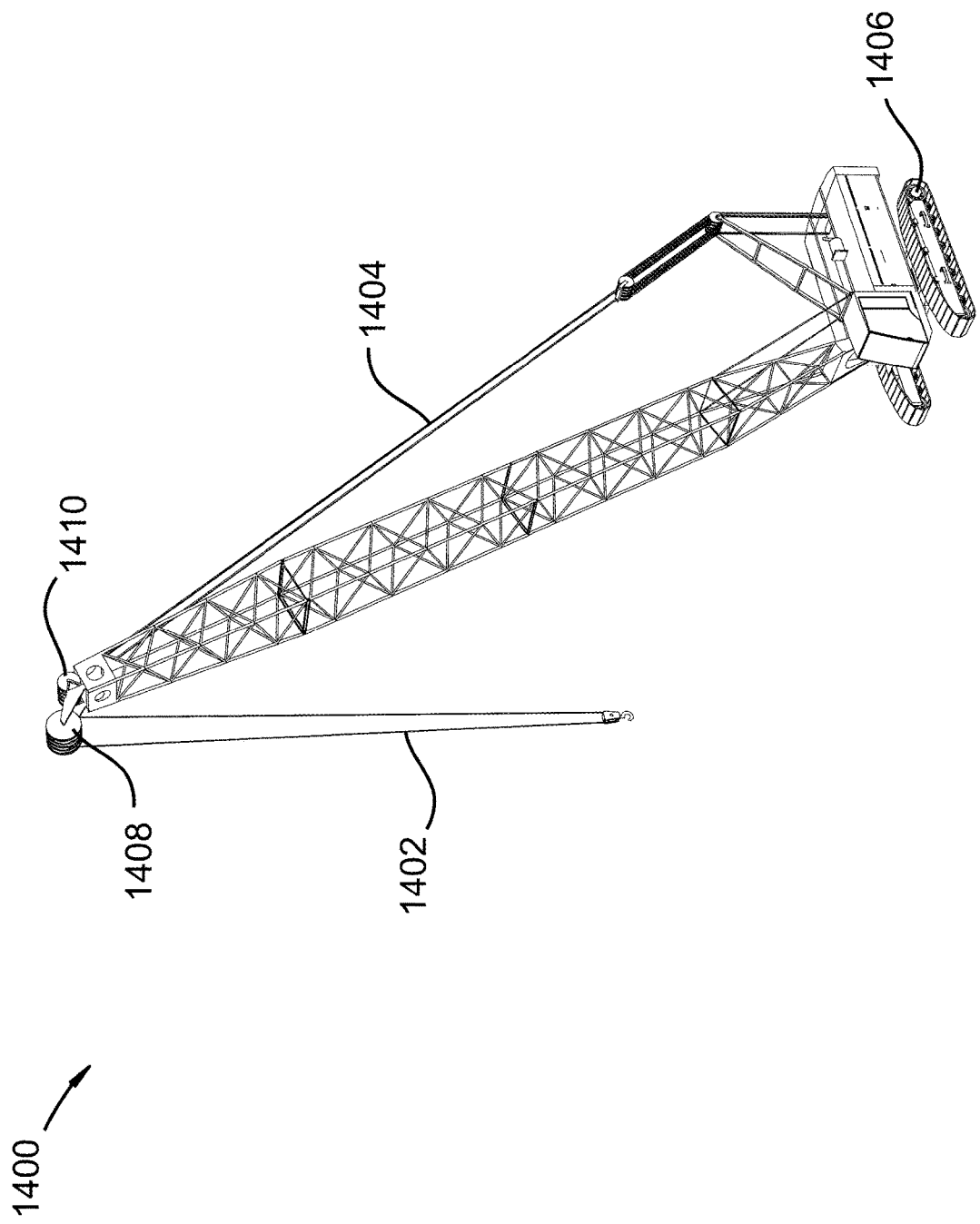
FIG. 14 is a side view of a crane in accordance with an embodiment of the invention.

FIG. 14 is a side view of a crane 1400 utilizing sensor system 1100, shown in FIG. 11, for motion control feedback of one or more moving systems of crane 1400. Cables 1402, 1404, and/or tracks 1406 may be connected to a drive system 1408, 1410 utilizing sensor system 1100 for feedback control. An inductive sensor and/or one or more magnets of the sensor system may be attached to or placed in near proximity to rotational pulleys, drives, drums, motors, shafts, gears, wheels, rollers, pivots, and/or to linear moving tractor parts such as arms, tracks, shovels, and/or levers. A crane hook may be controlled by one or more motors to perform an automated, repetitive movement. Position, speed, and direction information may be used to provide software safety limits and automated stopping points for movements of crane 1400. Backwards slippage, over rotation, unexpected movement, unexpected positional data, and/or speed deviations may be detected using sensor system 1100. If brakes are worn, motors fail, or other equipment wear or equipment malfunctions, software safety parameters may trigger equipment shutdown or automated maintenance actions.

Figure 15:
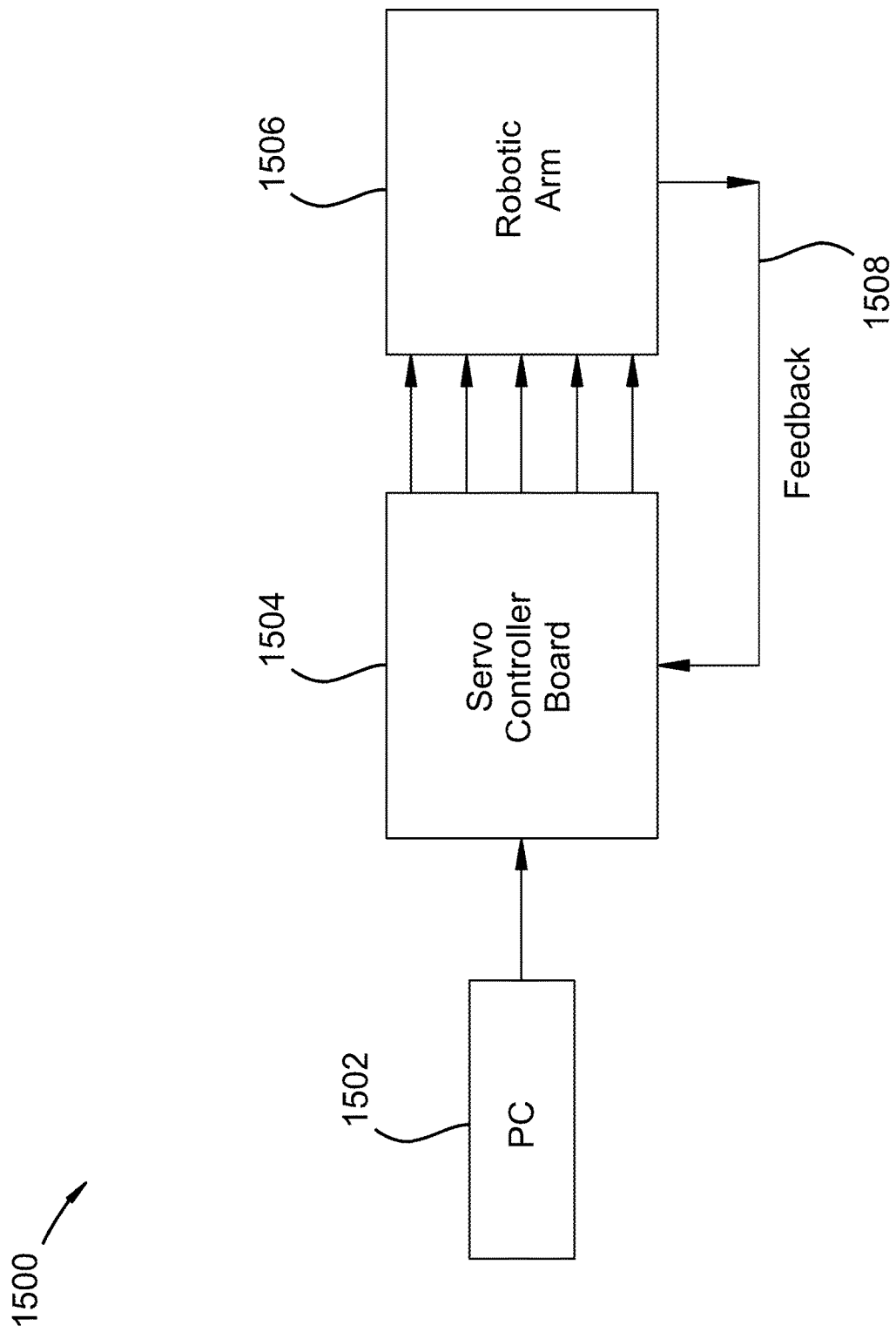
FIG. 15 is a flow diagram of a servo motor control system and method in accordance with an embodiment of the invention.

In FIG. 15, a flow diagram of a servo motor control system and method 1500 is shown in accordance with an embodiment of the invention. In control system 1500 a mechanical system 1506 (robotic arm) includes one or more inductive sensors detecting movement of magnetic north and south poles of one or more magnets as previously described in relation to FIGS. 1-11. The detected movement provides feedback 1508 to a servo controller 1504. The feedback may be used to detect position, orientation, direction of travel, or speed of movement of one or more components of mechanical system 1506. A user interface 1502 may communicate bi-directionally with servo controller 1504. Programming within servo controller 1504 and/or user interface 1502 may enable precision control of mechanical system 1506. Safety systems may be implemented using programming within servo controller 1504 and/or user interface 1502 and feedback 1508.

Figure 16:
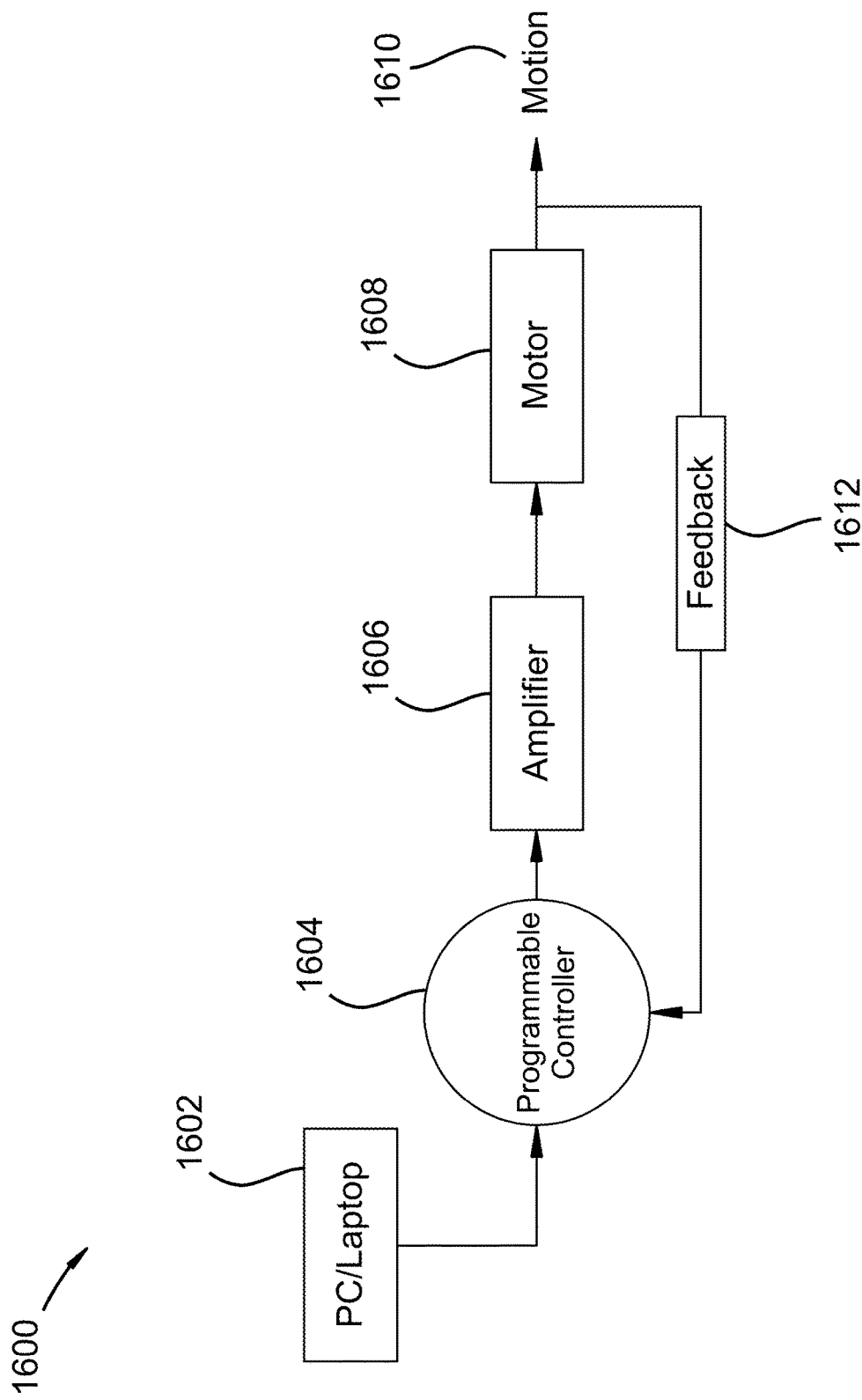
FIG. 16 is a flow diagram of a servo motor control system and method in accordance with an embodiment of the invention.

In FIG. 16, a flow diagram of a servo motor control system and method 1600 is shown in accordance with an embodiment of the invention. In control system 1600 a mechanical system 1608/1610 includes one or more inductive sensors detecting movement of magnetic north and south poles of one or more magnets as previously described in relation to FIGS. 1-11. The detected movement provides feedback 1612 to programmable controller 1604. The feedback may be used to detect position, orientation, direction of travel, or speed of movement of one or more components of mechanical system 1608/1610. A user interface 1602 may communicate bi-directionally with programmable controller 1604. Programming within controller 1604 and/or user interface 1602 may enable precision control of mechanical system 1608/1610. Safety systems may be implemented using programming within controller 1604 and/or user interface 1602 and feedback 1612. Amplifier 1606 may use feedback 1612 as a trigger for timed control signals sent to motor 1608.

Figure 17:
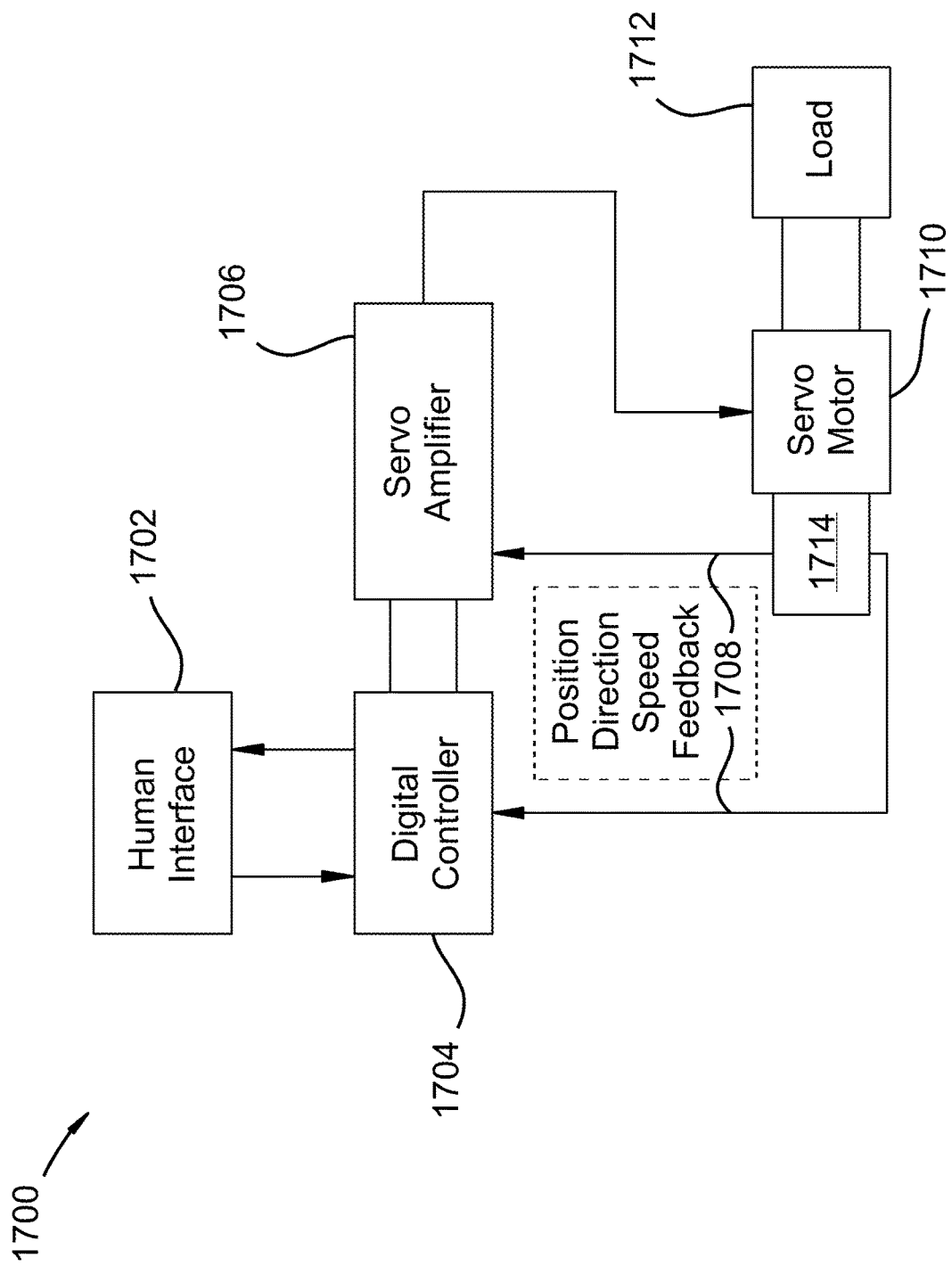
FIG. 17 is a flow diagram of a servo motor control system and method in accordance with an embodiment of the invention.

In FIG. 17, a flow diagram of a servo motor control system and method 1700 is shown in accordance with an embodiment of the invention. In control system 1700 a mechanical system 1710/1712 includes one or more inductive sensors 1714 detecting movement of magnetic north and south poles of one or more magnets as previously described in relation to FIGS. 1-11. The detected movement provides feedback 1708 to controller 1704 and servo amplifier 1706. The feedback may be used to detect position, orientation, direction of travel, or speed of movement of one or more components of mechanical system 1710/1712. A user interface 1702 may communicate bi-directionally with controller 1704 and/or servo amplifier 1706. Programming within controller 1704 and/or user interface 1702 may enable precision control of mechanical system 1710/1712. Safety systems may be implemented using programming within controller 1704 and/or user interface 1702 and feedback 1708. Amplifier 1706 may use feedback 1708 as a trigger for timed control signals sent to motor 1710.

Figure 18:
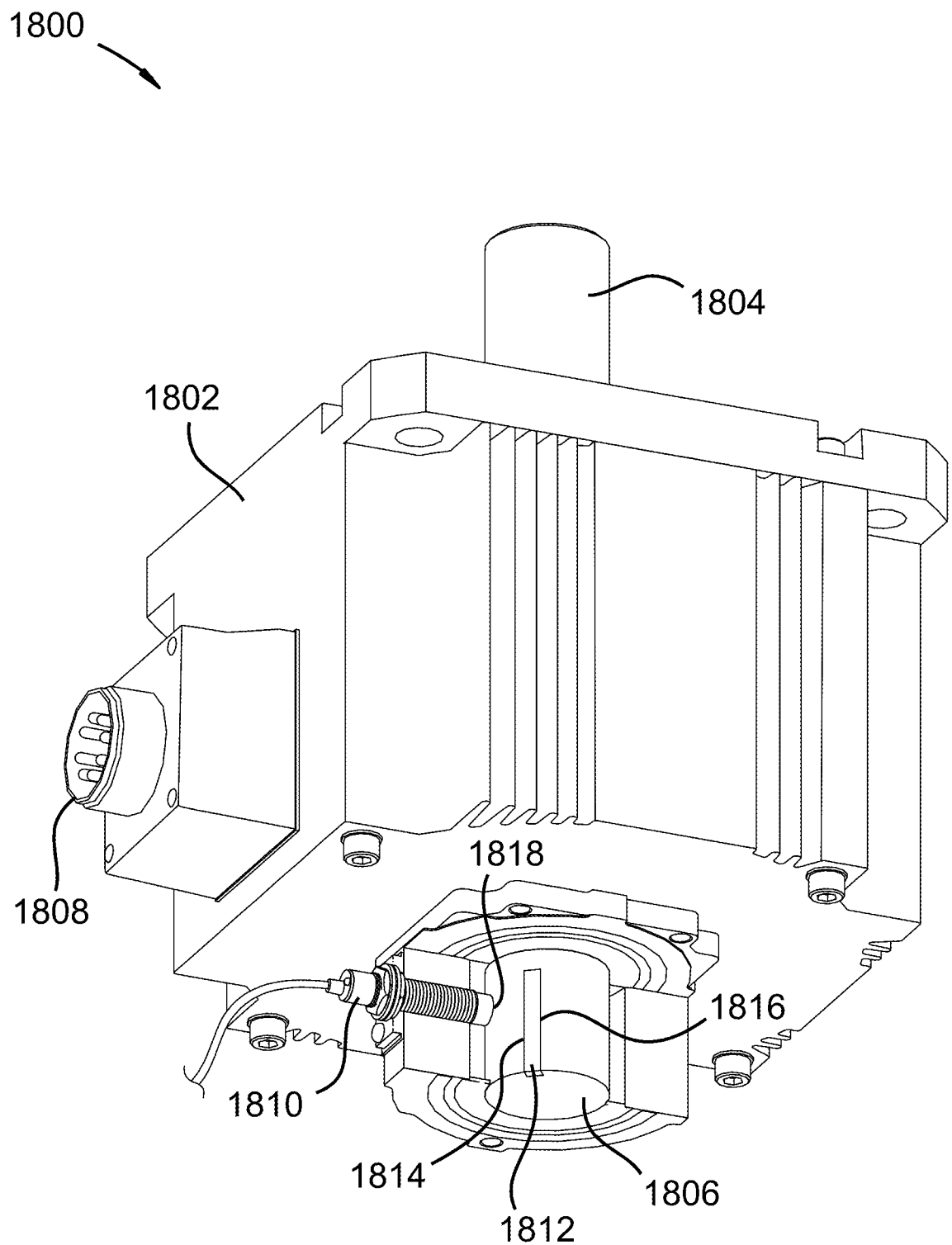
FIG. 18 is a perspective view of a servo motor in accordance with an embodiment of the invention.

In FIG. 18, a perspective view 1800 of servo motor 1802 is shown in accordance with an embodiment of the invention. Servo motor 1802 includes an inductive sensor 1810 mounted to or integrally formed into a servo motor housing 1802. Servo motor shaft 1804/1806 includes at least one magnet 1812 with north 1814 and south 1816 poles of magnet 1812 arranged to each intersect a face 1818 of inductive sensor 1810. Servo motor 1802 includes control lines 1808 for controlling servo motor 1802. Inductive sensor 1810 may be a hall effect sensor and may be removable from motor 1802 or integrally formed within the housing of servo motor 1802. Signals produced by inductive sensor 1810 provide feedback to detect position, orientation, direction of travel, or speed of movement of servo motor shaft 1804/1806. Motor control systems and motor safety systems may be implemented using signals produced by inductive sensor 1810 along with programming within a servo controller and/or user interface to limit travel, limit current, limit torque, limit position, limit speed, or limit orientation of shaft 1804/1806.

The apparatus and methods disclosed herein may be embodied in other specific forms without departing from their spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A servo motor system comprising:
one or more magnets fixed to a moving component of the servo motor system, each of the one or more magnets having a north pole and a south pole aligned to alternately induce a magnetic field into a face of an inductive sensor;
a processor and memory non-transitively programmed to:
determine an ON time of the inductive sensor as a result of moving the north pole and the south pole of each of the one or more magnets past the inductive sensor in an unknown direction;
determine the unknown direction to be a known first direction or a known second direction when the ON time is equal to a predetermined threshold associated with the first known direction or a predetermined threshold associated with the second known direction; and
one or more servo motors that receive control signals as a result of the moving of the north poles and the south poles of each of the one or more magnets past the inductive sensor, wherein the one or more servo motors cause motion of a mechanical system.

2. The servo motor system of claim 1, wherein the mechanical system is a robotic arm, an assembly line, or an electro-mechanical machine.

3. The servo motor system of claim 2, wherein the unknown direction is a rotational direction.

4. The servo motor system of claim 2, wherein the unknown direction is a linear direction.

5. The servo motor system of claim 1, wherein the inductive sensor additionally detects speed or position.

6. The servo motor system of claim 1, wherein the inductive sensor is a hall effect sensor.

7. The servo motor system of claim 1, wherein the inductive sensor is mounted to a servo motor or to a servo motor cover.

8. The servo motor system of claim 1, wherein the face of the inductive sensor is positioned perpendicular to a north-south direction of each of the one or more magnets.

9. The servo motor system of claim 1, wherein the face of the hall effect sensor is positioned between 1 and 0.010 of an inch from a surface of the one or more magnets.

10. The servo motor system of claim 3, wherein a speed of the rotation direction is between 1 and 20,000 rotations per minute.

11. The servo motor system of claim 1, wherein the one or more magnets are attached to a rotational drive system.

12. The servo motor system of claim 1, wherein the servo motor system additionally comprises one or more cable drive systems.

13. The servo motor system of claim 12, wherein the inductive sensor provides direction, position, and location of at least one cable of the cable drive systems.

14. The servo motor system of claim 12, wherein the inductive sensor provides signals that improve safety and control of the mechanical system.

15. The servo motor system of claim 14, wherein positional safety threshold parameters related to direction of rotation are used to achieve the improved safety and control.

16. The servo motor system of claim 14, wherein a load weight is determined using signals from the inductive sensor and motor current.

17. The servo motor system of claim 16, wherein the load weight is a weight exerted on the one or more cable drive systems.

18. The servo motor system of claim 17, wherein the mechanical system comprises two or more cable drive systems.

19. The servo motor system of claim 18, wherein the mechanical device is a manufacturing tool.

20. The servo motor system of claim 19, wherein the mechanical system is controlled in part by feedback produced by the inductive sensor.

* * * * *